(12) United States Patent
Jo et al.

(10) Patent No.: US 11,439,040 B2
(45) Date of Patent: Sep. 6, 2022

(54) HEAT EXCHANGER FOR COOLING ELECTRICAL DEVICE

(71) Applicant: Hanon Systems, Daejeon (KR)

(72) Inventors: Wi Sam Jo, Daejeon (KR); Jun Young Song, Daejeon (KR); Sun Mi Lee, Daejeon (KR); Hong-Young Lim, Daejeon (KR)

(73) Assignee: Hanon Systems, Daejeon (KR)

( * ) Notice: Subject to any disclaimer, the term of this patent is extended or adjusted under 35 U.S.C. 154(b) by 309 days.

(21) Appl. No.: 16/617,732

(22) PCT Filed: May 30, 2018

(86) PCT No.: PCT/KR2018/006158
§ 371 (c)(1),
(2) Date: Nov. 27, 2019

(87) PCT Pub. No.: WO2018/221959
PCT Pub. Date: Dec. 6, 2018

(65) Prior Publication Data
US 2020/0196484 A1    Jun. 18, 2020

(30) Foreign Application Priority Data
May 31, 2017  (KR) .......................... 10-2017-0067753

(51) Int. Cl.
*F28F 7/00*  (2006.01)
*H05K 7/20*  (2006.01)

(52) U.S. Cl.
CPC ................................ *H05K 7/20272* (2013.01)

(58) Field of Classification Search
CPC ............ H05K 7/20272; H05K 7/2089; H05K 7/20218

USPC ............................................ 165/80.4, 104.33
See application file for complete search history.

(56) References Cited

U.S. PATENT DOCUMENTS

| 7,200,007 B2 * | 4/2007 | Yasui | H02M 7/003 338/53 |
| 7,245,493 B2 * | 7/2007 | Inagaki | H01L 24/33 174/15.1 |
| 7,508,668 B2 * | 3/2009 | Harada | H01L 23/473 361/689 |

(Continued)

FOREIGN PATENT DOCUMENTS

| CN | 1508867 A | 6/2004 |
| JP | 2001-245478 A | 9/2001 |

(Continued)

OTHER PUBLICATIONS

Office Action issued in Corresponding Japanese Application No. 2019-566153, dated Dec. 22, 2020 (English Translation provided).

*Primary Examiner* — Claire E Rojohn, III
(74) *Attorney, Agent, or Firm* — Norton Rose Fulbright US LLP; James R. Crawford

(57) ABSTRACT

The present invention relates to a heat exchanger for cooling an electrical device, and more specifically, to a heat exchanger for cooling an electrical device, in which the tube-type cooling path parts may be coupled in multi-stages, the assembling of the electrical device and the cooling path part during the multi-stage coupling is easy, and cooling of both surfaces of the electrical device is possible through tight coupling between the electrical device and the cooling path part.

14 Claims, 15 Drawing Sheets

(56) References Cited

U.S. PATENT DOCUMENTS

| | | | |
|---|---|---|---|
| 7,571,759 B2 * | 8/2009 | Inagaki | F28D 1/0325 |
| | | | 165/80.4 |
| 7,940,526 B2 * | 5/2011 | Schulz-Harder | H01L 25/072 |
| | | | 165/185 |
| 8,391,008 B2 * | 3/2013 | Dede | H05K 7/20927 |
| | | | 361/689 |
| 9,950,628 B2 * | 4/2018 | Lei | H02M 7/003 |
| 9,961,808 B2 * | 5/2018 | Lei | H02M 7/003 |
| 10,017,073 B2 * | 7/2018 | Lei | B60L 50/61 |
| 10,283,436 B2 * | 5/2019 | Schuderer | H01L 29/1608 |
| 10,314,207 B1 * | 6/2019 | Skalski | H05K 5/0291 |
| 10,348,214 B2 * | 7/2019 | Nakatsu | B60L 50/64 |
| 10,448,545 B2 * | 10/2019 | Lim | H01M 10/60 |
| 10,607,919 B2 * | 3/2020 | Im | H01L 23/473 |
| 10,756,002 B2 * | 8/2020 | Stella | H01L 23/433 |
| 10,777,485 B2 * | 9/2020 | Takano | H01L 23/473 |
| 10,874,037 B1 * | 12/2020 | Gupta | B60K 6/387 |
| 10,971,431 B2 * | 4/2021 | Yamauchi | H01L 23/50 |
| 2001/0033477 A1 * | 10/2001 | Inoue | H01L 23/4334 |
| | | | 257/E23.098 |
| 2005/0051298 A1 | 3/2005 | Sakai | |
| 2005/0133210 A1 * | 6/2005 | Inagaki | F28D 1/0333 |
| | | | 165/152 |
| 2006/0119512 A1 * | 6/2006 | Yoshimatsu | H01L 25/112 |
| | | | 342/372 |
| 2006/0243422 A1 * | 11/2006 | Sakai | H01L 23/473 |
| | | | 257/E23.098 |
| 2007/0044952 A1 * | 3/2007 | Kuno | H01L 23/473 |
| | | | 257/E23.098 |
| 2008/0224303 A1 * | 9/2008 | Funakoshi | H01L 23/473 |
| | | | 257/E23.088 |
| 2011/0316143 A1 * | 12/2011 | Noritake | H01L 23/473 |
| | | | 257/713 |
| 2012/0001341 A1 * | 1/2012 | Ide | H01L 25/117 |
| | | | 257/773 |
| 2012/0087095 A1 * | 4/2012 | Tokuyama | H01L 23/467 |
| | | | 361/720 |
| 2012/0181679 A1 * | 7/2012 | Kadoguchi | H01L 23/3142 |
| | | | 257/E23.116 |
| 2012/0250253 A1 * | 10/2012 | Chou | H01L 24/33 |
| | | | 361/689 |
| 2012/0300402 A1 * | 11/2012 | Vos | H05K 1/0272 |
| | | | 165/104.33 |
| 2014/0291832 A1 * | 10/2014 | Schwarz | H01L 23/3735 |
| | | | 257/714 |
| 2015/0003012 A1 * | 1/2015 | Baba | H01L 21/4882 |
| | | | 361/689 |
| 2016/0126160 A1 * | 5/2016 | Jeong | H05K 7/20927 |
| | | | 29/890.035 |
| 2017/0314515 A1 * | 11/2017 | Oono | H01L 23/4334 |
| 2018/0098457 A1 * | 4/2018 | Takeuchi | H01L 23/473 |
| 2018/0138152 A1 * | 5/2018 | Jong | H01L 23/3735 |
| 2018/0261527 A1 * | 9/2018 | Takeuchi | H01L 23/473 |
| 2018/0332739 A1 * | 11/2018 | Takeuchi | H01L 23/473 |
| 2018/0352686 A1 * | 12/2018 | Song | H05K 7/20927 |
| 2019/0195572 A1 * | 6/2019 | Jo | F28F 1/126 |
| 2019/0234696 A1 * | 8/2019 | Jo | H05K 7/2089 |

FOREIGN PATENT DOCUMENTS

| | | |
|---|---|---|
| JP | 2004214623 | 7/2004 |
| JP | 2006093293 | 4/2006 |
| JP | 2008-294283 A | 12/2008 |
| JP | 2011-228566 A | 11/2011 |
| JP | 2012-009532 A | 1/2012 |
| JP | 2014-187118 A | 10/2014 |
| JP | 2016-029693 A | 3/2016 |
| KR | 10-2015-0033259 A | 4/2015 |
| KR | 20150033259 A * | 4/2015 |

* cited by examiner

HEAT EXCHANGER FOR COOLING ELECTRICAL DEVICE

This application is a national phase under 35 U.S.C. § 371 of International Application No. PCT/KR2018/006158 filed on May 30, 2018, which claims the benefit of priority from Korean Patent Application No. 10-2017-0067753 filed on May 31, 2017, which are hereby incorporated by reference in their entireties.

TECHNICAL FIELD

The present invention relates to a heat exchanger for cooling an electrical device, and more particularly, to a heat exchanger for cooling an electrical device, in which the tube-type cooling path parts may be coupled in multi-stages, the assembling of the electrical device and the cooling path part during the multi-stage coupling is easy, and cooling of both surfaces of the electrical device is possible through tight coupling between the electrical device and the cooling path part.

BACKGROUND ART

In general, a power control unit (PCU), which controls power supplied from a battery for driving to supply the power to a motor in a desired state, is additionally mounted in a vehicle such as a hybrid vehicle, a fuel cell vehicle, or an electric vehicle using a driving force of the motor.

The PCU includes electrical devices such as an inverter, a smoothing capacitor, and a converter. As power is supplied, the electrical devices generate heat, and thus a separate cooling device is required for cooling the electrical devices.

Japanese Patent Laid-Open Publication No. 2001-245478 (published on Sep. 7, 2001 and entitled "Apparatus for Cooling Inverter") has disclosed an inverter in which a semiconductor module having a semiconductor element such as an insulated gate bipolar transistor (IGBT), and a diode embedded therein is used, and Japanese Patent Laid-Open Publication No. 2008-294283 (published on Dec. 4, 2008 and entitled "Semiconductor Apparatus") has disclosed a heat sink mounted to be in contact with a lower surface of a semiconductor element and formed to perform heat exchange by a fluid flowing therein.

This single-sided cooling scheme described above has a limitation in cooling performance, and thus a double-sided cooling scheme has been devised in order to solve the problem. In the case of the double-sided cooling scheme, an electrical device is inserted into a space between heat exchangers, and conditions in which an electrical device insertion interval between the heat exchangers should be larger than a height of the electrical device, and the electrical device and the heat exchanger should be tightly pressed against each other in order to increase heat transfer performance of the heat exchanger need to be satisfied.

A heat exchanger for the double-sided cooling illustrated in FIG. 1 may include tubes 20 positioned on opposite surfaces of an electrical device 10 and in which a heat exchange medium flows, and tanks 30 coupled to opposite ends of the tubes 20 and through which the heat exchange medium flows in or out.

Here, the heat exchanger for the double-sided cooling illustrated in FIG. 1 is formed by brazing coupling, and the electrical device 10 needs to be inserted after an insertion space for the electrical device 10 is fixed. As a result, it is not easy to insert the electrical device 10, which is problematic.

In addition, in the case where an interval between the tubes 20 is wide to facilitate insertion of the electrical device, the electrical device 10 and the tube 20 are not tightly pressed against each other, which results in deterioration of heat exchange efficiency.

A heat exchanger for double-sided cooling illustrated in FIG. 2 is a heat exchanger formed by bending a tube 50 and in which an electrical device 40 may be inserted into a space formed by bending the tube 50 to press the tube 50 and the electrical device 40 against each other.

Here, in the heat exchanger for double-sided cooling illustrated in FIG. 2, since the electrical device 40 needs to be inserted into the space formed by bending the tube 50, it is not possible to cool a large number of electrical devices, and an additional plate for pressing the device 40 needs to be provided.

Further, in the case of multi-stage stacking, since a height of the electrical device 40 is small, it is difficult to arrange tanks 60 for connection between the respective tubes 40.

Therefore, the stacked tanks 60 may be alternately arranged in a zigzag. In this case, however, a connection part for connection between the tanks 60 that are arranged at an inner side may still not be formed in the case of multi-stage stacking as illustrated in FIG. 3. As a result, in the case of the heat exchanger for double-sided cooling illustrated in FIGS. 2 and 3, it is difficult to implement stacking of multiple heat exchangers in multi-stages.

DISCLOSURE

Technical Problem

An object of the present invention is to provide a heat exchanger for cooling an electrical device, in which the tube-type cooling path parts may be coupled in multi-stages, the assembling of the electrical device and the cooling path part during the multi-stage coupling is easy, and cooling of both surfaces of the electrical device is possible through tight coupling between the electrical device and the cooling path part.

Technical Solution

In one general aspect, a heat exchanger for cooling an electrical device includes: cooling assemblies 100 each including a cooling path part 110 including a cooling path 111 in which a cooling fluid flows, and connection plates 120 into which opposite ends of the cooling path part 110 in a length direction are inserted, respectively, and which are coupled to the cooling path part 110 while each being in contact with opposite ends of the cooling path part 110 in a height direction; an inflow and outflow part 200 including an inflow part 210 connected to one of uppermost connection plates 120 or lowermost connection plates 120 of the multiple cooling assemblies 100 stacked in the height direction to allow the cooling fluid to flow in, and an outflow part 220 connected to one of the remaining connection plates 120 to allow the cooling fluid to flow out; and a connection block 300 connected between the connection plates 120 and forming a path in a stacking direction.

The opposite ends of the cooling path part 110 in the length direction may be open, and the cooling path part 110 may further include cut parts 112 formed by cutting inner sides of the opposite ends of the cooling path part 110 in the length direction, and fixing parts 113 formed at opposite ends of the cut part 112 in a width direction.

In the heat exchanger 1000 for cooling an electrical device, an interval 129 between adjacent cooling path parts 110 may vary depending on a height of the electrical device 1 inserted between the cooling path parts 110.

In the heat exchanger 1000 for cooling an electrical device, an interval between adjacent cooling path parts 110 may vary depending on a height of the electrical device 1 inserted between the cooling path parts 110.

The connection plate 120 may include an upper plate 121 coupled to the cooling path part 110 so as to overlap with a predetermined region of an upper surface of each of the opposite ends of the cooling path part 110 in the length direction, a lower plate 122 coupled to the cooling path part 110 so as to overlap with a predetermined region of a lower surface of each of the opposite ends of the cooling path part 110 in the length direction, and a middle plate 123 connecting the upper plate 121 and the lower plate 122 to each other in the height direction.

The connection plate 120 may have an upper plate through-hole 121-1 and a lower plate through-hole 122-1 formed to penetrate through the upper plate 121 and the lower plate 122, respectively, at a position corresponding to a position of the cut part 112, the upper plate 121 and the lower plate 122 being positioned to be connected to one of the inflow and outflow part 200 and the connection block 300.

The connection block 300 may include an upper connection block 310 which is in contact with a lower surface of the lower plate 122 and has a communicating hole 330 communicating with the lower plate through-hole 122-1, a lower connection block 320 which is in contact with an upper surface of the upper plate 121, is coupled to the upper connection block 310, and has a communicating hole 330 communicating with the upper plate through-hole 121-1, and a sealing member 340 disposed in a region in which the upper connection block 310 and the lower connection block 320 are coupled to each other to prevent a leakage of a heat exchange medium.

The sealing member 340 may be one or more selected from a rubber gasket and a liquid gasket.

The connection block 300 may include a first through-hole insertion part 330-1 protruding upward at an edge of an upper side of the communicating hole 330 of the upper connection block 310 and inserted into the lower plate through-hole 122-1, and a second through-hole insertion part 330-2 protruding downward at an edge of a lower side of the communicating hole 330 of the lower connection block 320 and inserted into the upper plate through-hole 121-1.

A partition wall 111-1 extending in the length direction in the cooling path 111 may be formed in the cooling path part 110.

A thickness of the fixing part 113 of the cooling path part 110 in a width direction may be larger than a thickness of the partition wall 111-1.

The connection plate 120 may include an insertion limiting part 124 formed in at least one of the upper plate 121 or the lower plate 122 to protrude inward in the height direction.

In the heat exchanger 1000 for cooling an electrical device, the path for a heat exchange medium may vary depending on disposition of the inflow and outflow part 200 and the connection block 300.

In the heat exchanger 1000 for cooling an electrical device, at least one connection block 300 may be disposed between the connection plates 120 of the cooling assemblies 100 stacked in multi-stages.

The heat exchanger 1000 for cooling an electrical device may further include a support block 400 allowing a predetermined interval between the cooling path parts 110 to be maintained.

Heights of the connection block 300 and the support block 400 may be the same as a height of the electrical device 1.

Advantageous Effects

In the heat exchanger for cooling an electrical device according to the present invention, the tube-type cooling path parts may be coupled in multi-stages, the assembling of the electrical device and the cooling path part is easy during the multi-stage coupling, and cooling of both surfaces of the electrical device is possible.

Further, in the heat exchanger for cooling an electrical device according to the present invention, each of the cooling assemblies is formed by using the cooling path part and the connection plate, and the cooling assemblies may be mechanically coupled in multi-stages by using the connection block, such that it is possible to facilitate insertion of the electrical device and increase a pressing force between the cooling path part and the electrical device, thereby improving cooling performance.

Further, in the heat exchanger for cooling an electrical device according to the present invention, the cooling assembly is formed by brazing the cooling path part and the connection plate, and a force is applied in a stacking direction during the assembling of the electrical device and the cooling path part using the connection block to allow the electrical device and the cooling path part to be in close contact with each other, such that the cooling performance is improved, and assemblability is also greatly improved.

Further, in the heat exchanger for cooling an electrical device according to the present invention, the number of stacked cooling path parts may be increased depending on the number of electrical devices that are needed, and thus it is favorable for cooling a large number of electrical devices, and a range in which the cooling is applied may also be optionally expanded.

Further, in the heat exchanger for cooling an electrical device according to the present invention, a path in which a cooling fluid flows may be formed to have a series structure, a parallel structure, or a structure in which the series structure and the parallel structure are mixed, in consideration of a heat generation amount depending on a function of the electrical device.

DETAILED DESCRIPTION OF MAIN ELEMENTS

Figure 1:
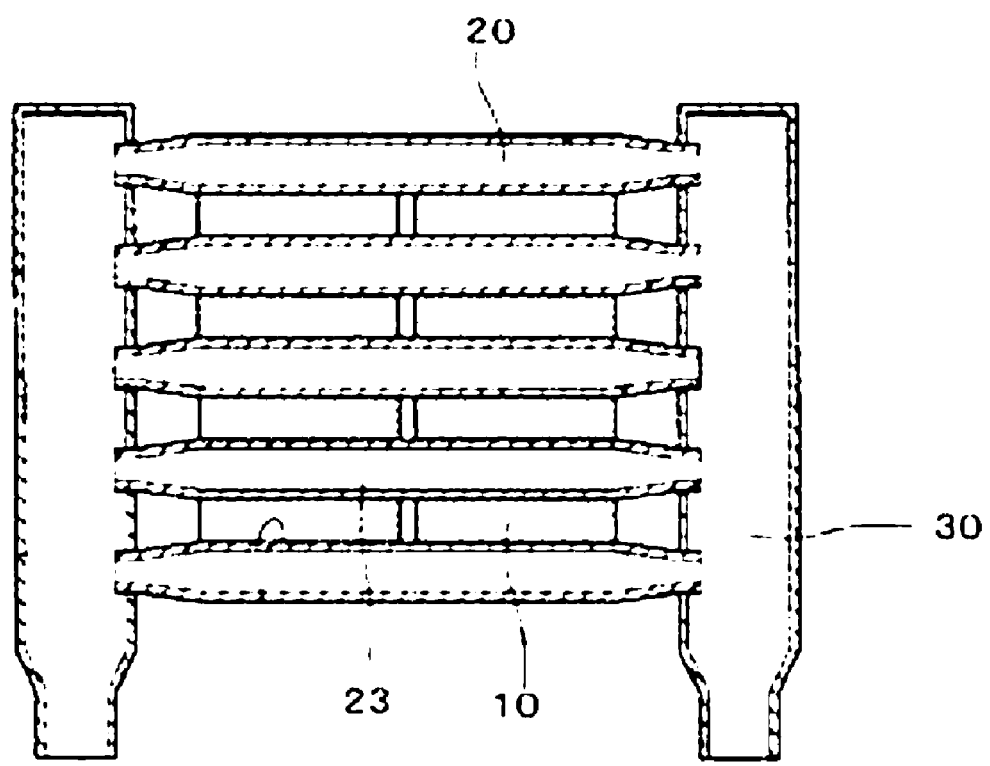
FIG. 1 is a view illustrating an apparatus for cooling an electrical device according to the related art.
Figure 2:
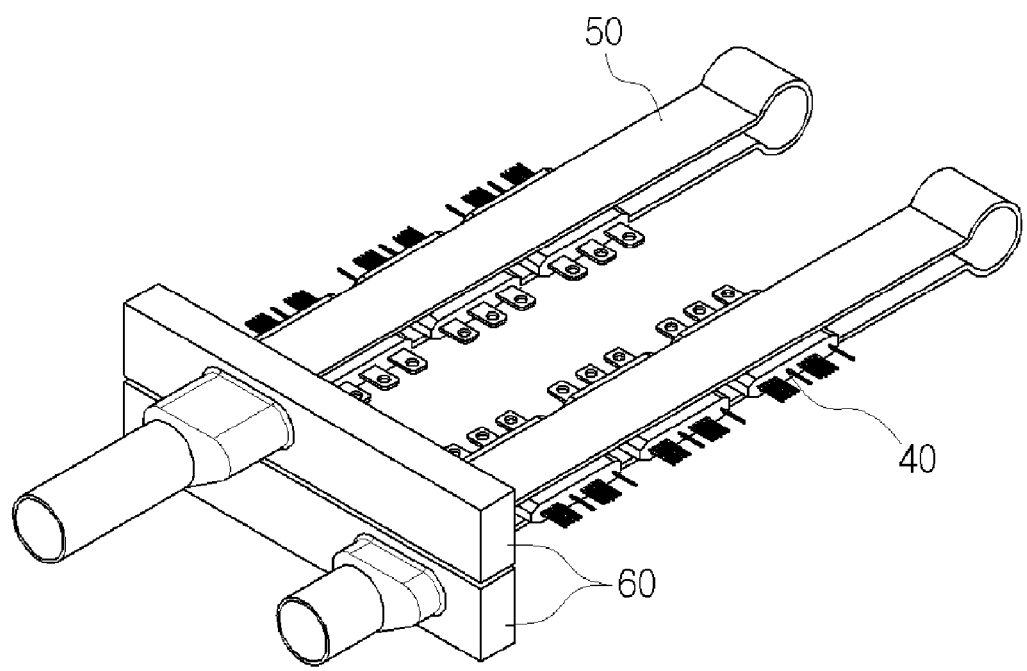
FIG. 2 is a view illustrating a heat exchanger for cooling an electrical device according to the related art.
Figure 3:
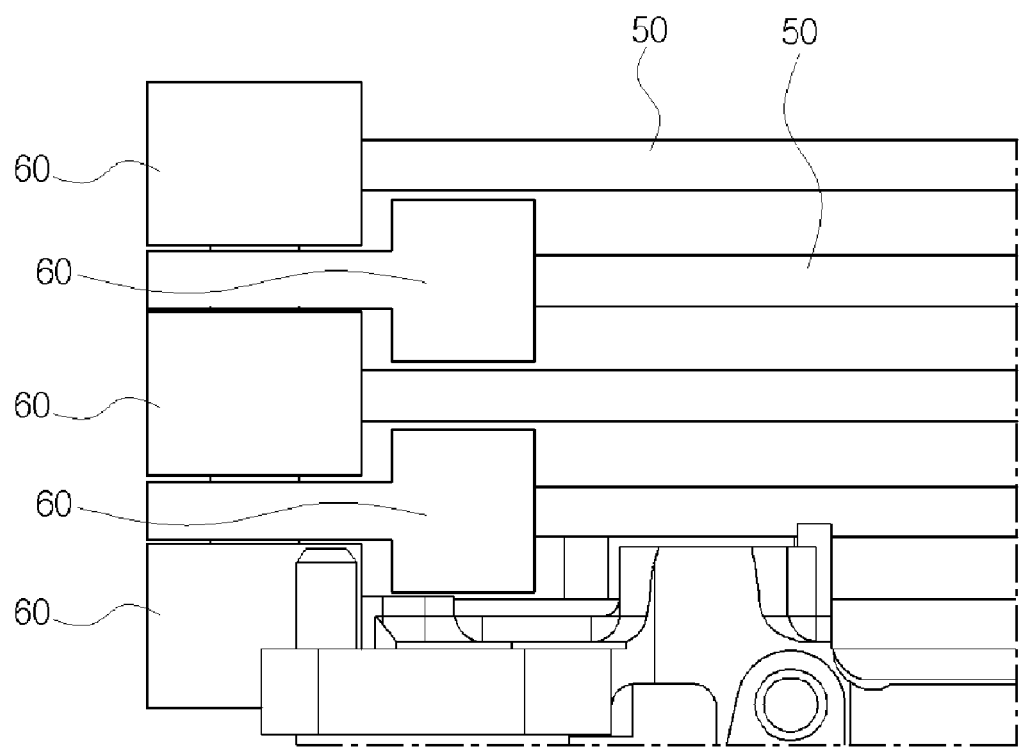
FIG. 3 is another view illustrating the heat exchanger for cooling an electrical device according to the related art.

1000: Heat exchanger for cooling electrical device according to embodiment of present invention
100: Cooling assembly
110: Cooling path part
111: Cooling path
111-1: Partition wall
112: Cut part
113: Fixing part
120: Connection plate
121: Upper plate
121-1: Upper plate through-hole
122: Lower plate
122-1: Lower plate through-hole
123: Middle plate
124: Limiting part
200: Inflow and outflow part
210: Inflow part
220: Outflow part
300: Connection block
310: Upper connection block
320: Lower connection block
330: Communicating hole
330-1: First through-hole insertion part
330-2: Second through-hole insertion part
340: Sealing member
400: Support block
1: Electrical device

BEST MODE

Hereinafter, the heat exchanger for cooling an electrical device according to an embodiment of the present invention described above will be described in detail with reference to the accompanying drawings.

Figure 4:
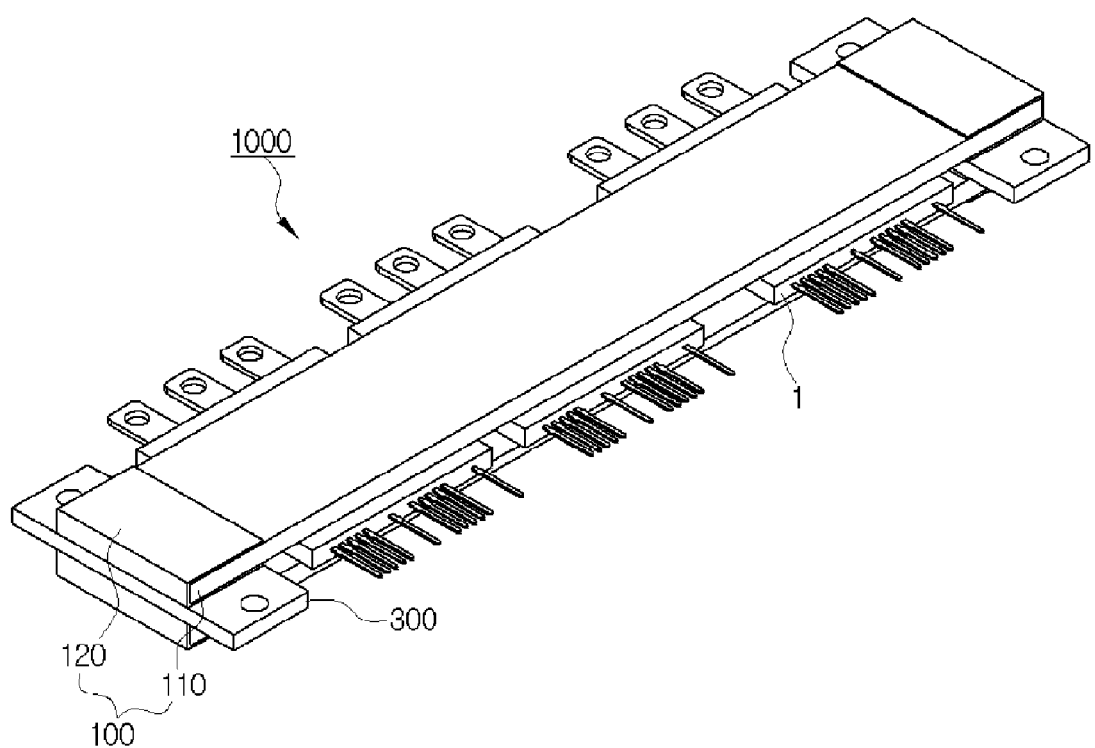
FIG. 4 is a perspective view illustrating a heat exchanger for cooling an electrical device according to an embodiment of the present invention.
Figure 5:
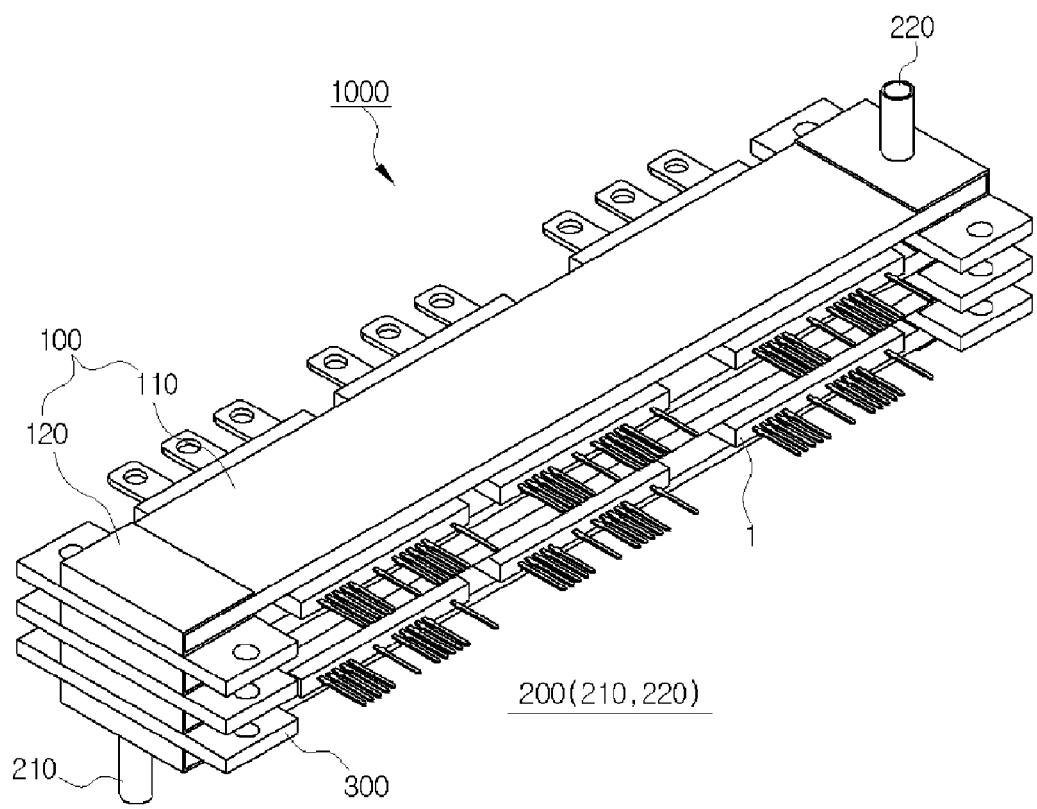
FIG. 5 is another perspective view illustrating the heat exchanger for cooling an electrical device according to an embodiment of the present invention.
Figure 6:
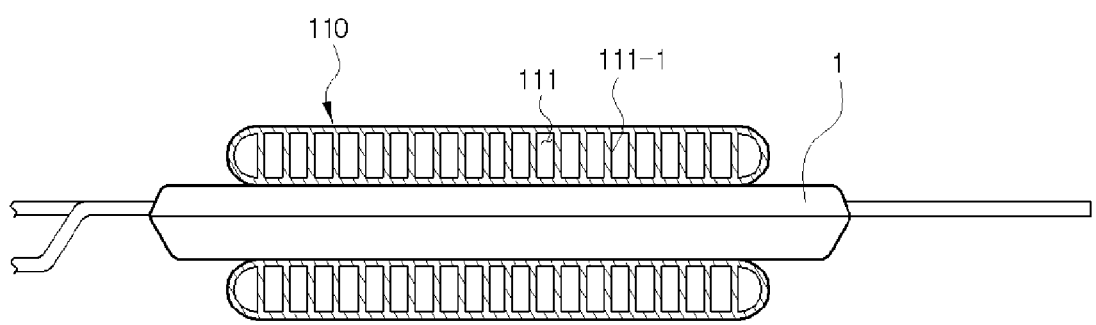
FIG. 6 is a cross-sectional view illustrating a cooling path part of the heat exchanger for cooling an electrical device according to an embodiment of the present invention.
Figure 7:
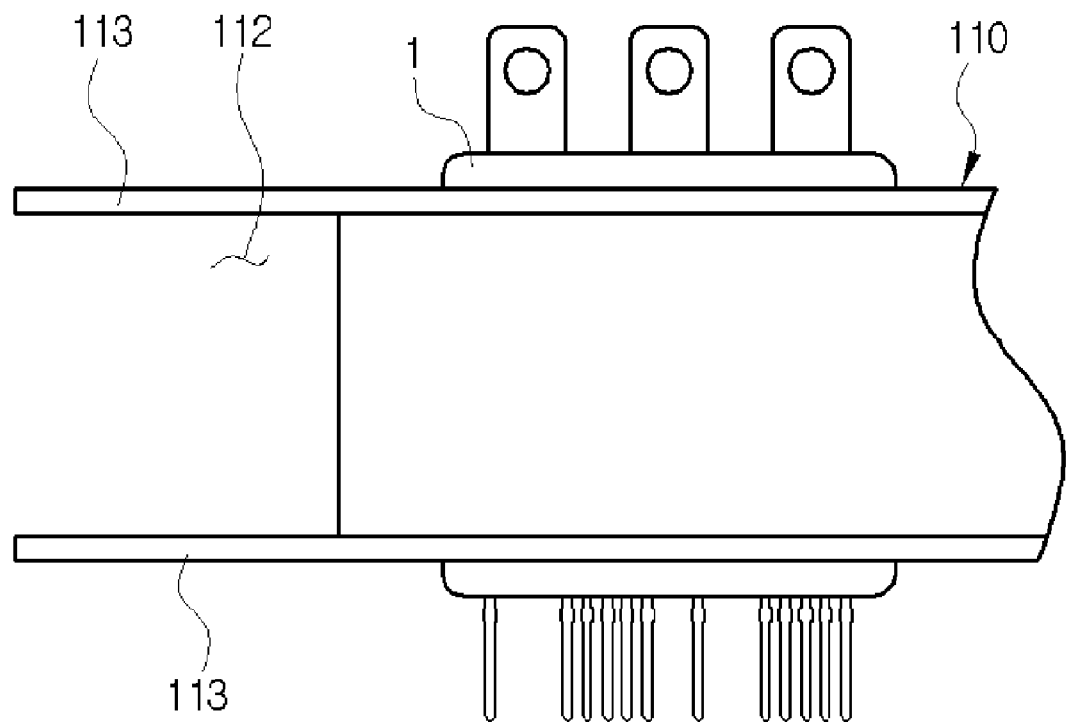
FIG. 7 is a plan view illustrating the cooling path part constituting the heat exchanger for cooling an electrical device according to an embodiment of the present invention.

As illustrated in FIGS. 4 and 5, a heat exchanger 1000 for cooling an electrical device according to an embodiment of the present invention mainly includes cooling assemblies 100, an inflow and outflow part 200, and a connection block 300.

The cooling assemblies 100 each include a cooling path part 110 and connection plates 120, and multiple cooling assemblies 100 may be stacked in a height direction.

As illustrated in FIGS. 4 to 7, the cooling path part 110 may be formed in a tube shape and may be produced through an extrusion process. The cooling path part 110 includes a cooling path 111 in which a cooling fluid flows, and opposite ends of the cooling path part 110 in a length direction are open.

Here, the cooling path part 110 includes a cut part 112 formed by cutting an inner side of each of the opposite ends of the cooling path part 110 in the length direction, and fixing parts 113 are formed at the opposite ends each of which the inner side is cut to form the cut part 112.

The cooling path part 110 may further include an inner fin (not illustrated) in the cooling path 111 to improve cooling efficiency as needed, and a partition wall 111-1 separating a space in the cooling path 111 in a width direction of the cooling path 111 may be formed to extend in the length direction in the extrusion process for the cooling path part 110.

Figure 8:
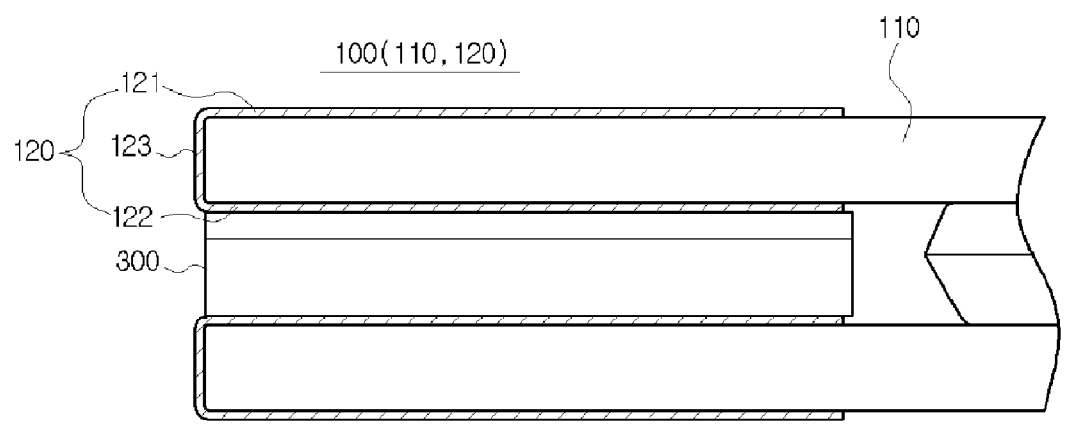
FIG. 8 is a view illustrating the cooling path part constituting the heat exchanger for cooling an electrical device according to an embodiment of the present invention.
Figure 9:
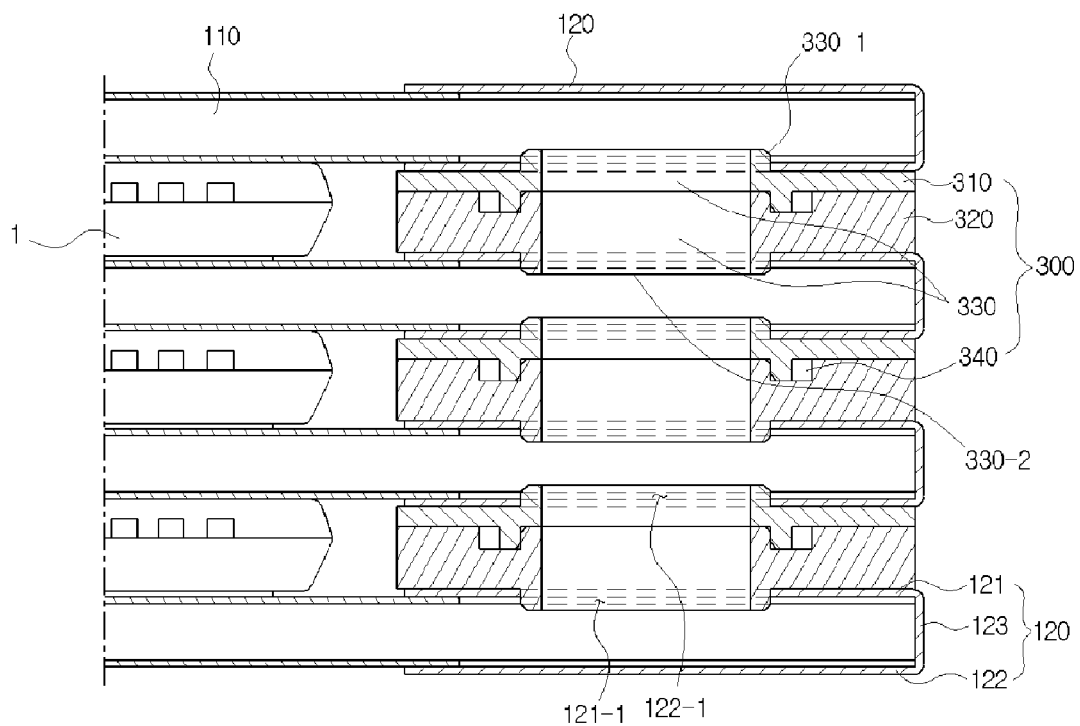
FIG. 9 is a cross-sectional view illustrating the heat exchanger for cooling an electrical device according to an embodiment of the present invention.

As illustrated in FIGS. 8 and 9, the opposite ends of the cooling path part 110 in the length direction may each be inserted into the connection plate 120, and the connection plate 120 is coupled to the cooling path part 110 while being in contact with opposite ends of the cooling path part 110 in a height direction.

Here, the connection plate 120 may include an upper plate 121, a lower plate 122, and a middle plate 123, the upper plate 121 is coupled to the cooling path part 110 so as to overlap with a predetermined region of an upper surface of each of the opposite ends of the cooling path part 110 in the length direction and upper surfaces of the fixing parts 113, the lower plate 122 is coupled to the cooling path part 110 so as to overlap with a predetermined region of a lower surface of each of the opposite ends of the cooling path part 110 in the length direction and lower surfaces of the fixing parts 113, and the middle plate 123 is formed to have a height corresponding to a height of the cooling path part 110 and connect the upper plate 121 and the lower plate 122 to each other.

That is, the connection plate 120 is formed to have a cross section with an open rectangle shape including the upper plate 121, the lower plate 122, and the middle plate 123, and the upper plate 121, the lower plate 122, and the middle plate 123 are formed integrally. Therefore, the cooling path part 110 and the connection plate 120 may be brazed after the cooling path part 110 is inserted.

As illustrated in FIG. 5, the inflow and outflow part 200 includes an inflow part 210 and an outflow part 220.

The inflow part 210 is connected to one of the uppermost connection plates 120 or the lowermost connection plates 120 to allow the cooling fluid to flow in, and the outflow part 220 is connected to one of the uppermost connection plates 120 or the lowermost connection plates 120 that are not connected to the inflow part 210 to allow the cooling fluid to flow out.

Here, an inlet pipe and an outlet pipe each having a pipe shape may be further coupled to the inflow part 210 and the outflow part 220, respectively, and an inflow passage and an outflow passage each having a shape other than the pipe shape may be connected.

As illustrated in FIG. 9, the connection block 300 may communicate with the inflow and outflow part 200, and a connection path in which the cooling medium flows in the stacking direction may be formed between the multiple connection plates 120 that are stacked.

As described above, the connection plates 120, the inflow and outflow part 200, and the connection block 300 are formed to communicate with each other in order to form the connection path for the flow of the cooling fluid between the cooling path parts 110.

More specifically, an upper plate through-hole 121-1 may be formed to penetrate through the upper plate 121 at a position corresponding to a position of the cut part 112 to allow the cooling fluid to flow to the cooling path part 110 coupled to the upper plate 121, and a lower plate through-hole 122-1 may be formed in the lower plate 122.

Further, the connection block 300 may include an upper connection block 310 and a lower connection block 320, the upper connection block 310 is in contact with a lower surface of the lower plate 122 and has a communicating hole 330 communicating with the lower plate through-hole 122-1 formed in the lower plate 122, and the lower connection block 320 is in contact with an upper surface of the upper plate 121 and has a communicating hole 330 communicating with the upper plate through-hole 121-1 formed in the upper plate 121.

Here, the connection block 300 may further include a sealing member 340 disposed in a region in which the upper connection block 310 and the lower connection block 320 are coupled to each other to prevent a leakage of the cooling fluid.

The sealing member 340 may be a rubber gasket, or may be a member that is cured, like a liquid gasket.

The connection block 300 is formed to have the same height as that of an electrical device 1, such that both surfaces of the electrical device 1 and the cooling path part 110 may be in surface-contact with each other.

As described above, in the heat exchanger 1000 for cooling an electrical device according to an embodiment of the present invention, the cooling fluid flowing in through the inflow part 210 passes through the cut part 112 of the connection plate 120, flows to the cooling path 111 in the cooling path part 110, passes through the communicating hole 330 of the connection block 300 that is connected to the upper plate through-hole 121-1 or the lower plate through-hole 122-2 to move to the adjacent cooling path part 110 in the stacking direction, passes through the adjacent upper plate through-hole 121-1 or lower plate through-hole 122-1, and the cut part 112, and moves to the cooling path 111 in the cooling path part 110.

Further, in the heat exchanger 1000 for cooling an electrical device according to an embodiment of the present invention, the connection plate 120 and the connection block 300 are connected to each other to form a path in which the cooling fluid flows in the stacking direction, and the connection block 300 may include a first through-hole insertion part 330-1 and a second through-hole insertion part 330-2 to facilitate the coupling of the connection plate 120 and the connection block 300.

The first through-hole insertion part 330-1 protrudes upward at an edge of an upper side of the communicating hole 330 of the upper connection block 310 and is inserted into the lower plate through-hole 122-1, and the second through-hole insertion part 330-2 protrudes downward at an edge of a lower side of the communicating hole 330 of the lower connection block 320 and is inserted into the upper plate through-hole 121-1.

In the heat exchanger 1000 for cooling an electrical device according to an embodiment of the present invention, as the connection block 300 and the connection plate 120 are coupled to each other in the above-described manner, the cooling path parts 110 may be stacked in multi-stages in the height direction, and the electrical device 1 may be disposed between the cooling path parts 110.

That is, in the case where the cooling assemblies 100 each including the cooling path part 110 and the connection plate 120, and the electrical devices 1 are stacked in multi-stages, the cooling path part 110 and the electrical device 1 are mechanically assembled by using the connection plate 120 and the connection block 300, such that it is possible to facilitate insertion of the electrical device 1 and increase a pressing force between the cooling path part 110 and the electrical device 1, thereby improving cooling performance.

Further, as an example, the electrical device 1 may be inserted into a space formed by stacking the cooling path parts 110 in multi-stages, and an interval between adjacent cooling path parts 110 may vary depending on the height of the inserted electrical device 1 in each layer.

That is, in the case where the height of the interposed electrical device 1 varies for each layer, a distance between the cooling path parts 110 stacked in multi-stages may correspond to the height of the electrical device 1 to allow the electrical device 1 to be coupled to the cooling path part 110 while being in close contact with the cooling path part 110.

In the heat exchanger 1000 for cooling an electrical device according to an embodiment of the present invention, the opposite ends of the cooling path part 110 is inserted into and coupled to the connection plates 120, respectively, to form the cooling assembly, and the connection plate 120 is in contact with the upper and lower surfaces of the fixing parts 113 formed at the opposite ends of the cooling path part 110.

Figure 10:
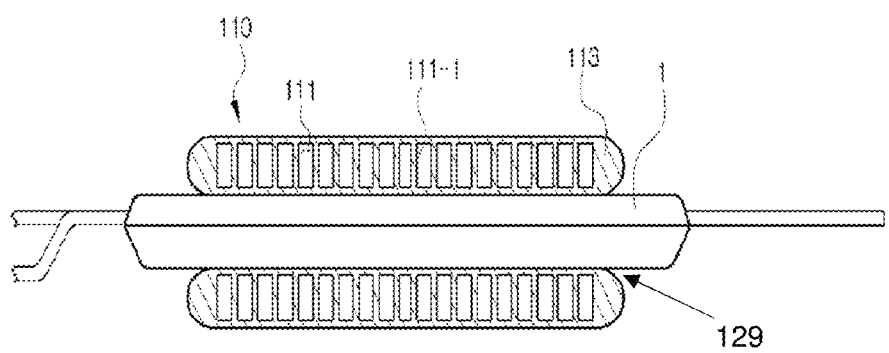
FIG. 10 is a view illustrating an example of the cooling path part of the heat exchanger for cooling an electrical device according to an embodiment of the present invention.

Here, it is preferable that the fixing part 113 is formed to have a thickness larger than that of the partition wall 111-1 formed in the cooling path 111 as illustrated in FIG. 10 to improve bondability between the fixing part 113 and the connection plate 120.

That is, in the heat exchanger 1000 for cooling an electrical device according to an embodiment of the present invention, the cut part 112 is formed by cutting the inner side of each of the opposite ends of the cooling path part 110 in the length direction, and the upper plate through-hole 121-1 of the upper plate 121 and the lower plate through-hole 122-1 of the lower plate 122 of the connection plate 120 are formed to communicate with the cooling path part 110 through the cut part 112.

Since the cut part 112 is formed, a portion of each of the opposite ends of the cooling path part 110 in the length direction and the fixing parts 113 are coupled to the plate 120. As a result, bondability between the fixing part 113 with a small thickness and the plate 120 may deteriorate. Therefore, it is preferable that the fixing part 112 is formed to have a thickness larger than that of the partition wall 111-1 to improve the bondability.

However, a cross section of the cooling path part 110 may have various shapes such as a rectangular shape and a triangular shape, in addition to a shape in which opposite ends of the cooling path part are rounded, as long as the bondability between the fixing part 113 and the plate 120 is improved.

Figure 11:
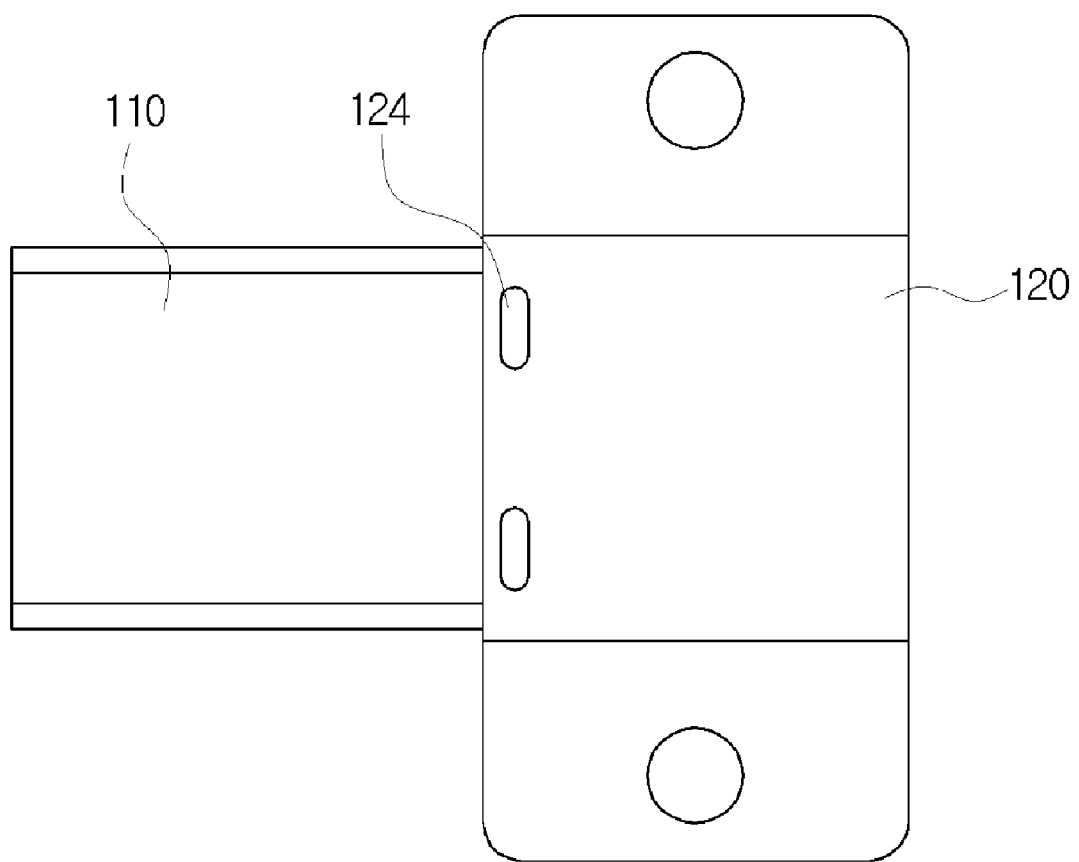
FIG. 11 is a view illustrating an example of a connection plate constituting the heat exchanger for cooling an electrical device according to an embodiment of the present invention.
Figure 12:
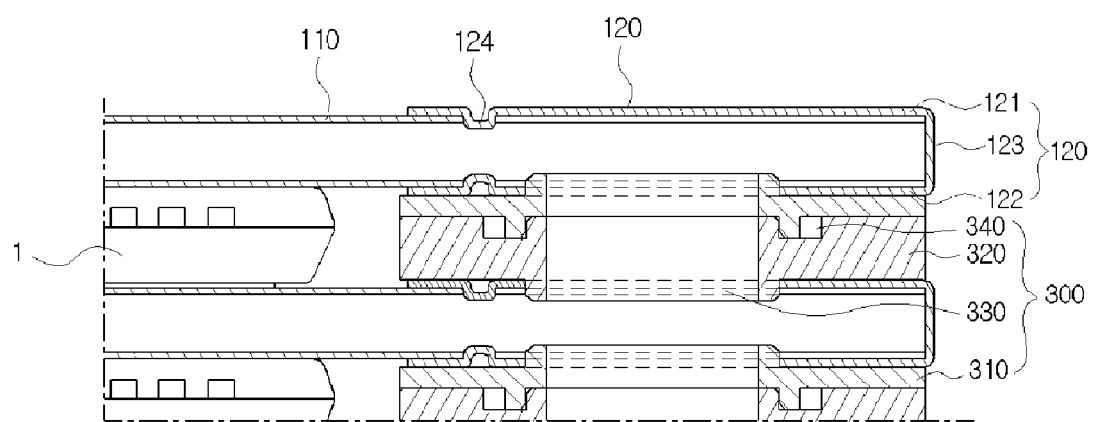
FIG. 12 is another view illustrating the example of the connection plate constituting the heat exchanger for cooling an electrical device according to an embodiment of the present invention.

Further, in the heat exchanger 1000 for cooling an electrical device according to an embodiment of the present invention, an insertion limiting part 124 protruding in a direction to be bonded to the fixing part 113, through a forming process may be formed in at least one of the upper plate 121 or the lower plate 122 of the plate 120 as illustrated in FIGS. 11 and 12.

It is preferable that the insertion limiting part 124 is formed at a position except for a position at which the fixing part 113 is inserted and coupled, and assemblability of the cooling path part 110 and the connection plate 120 may be improved by limiting an insertion position of the cooling path part 110 using the insertion limiting part 124.

A shape of the insertion limiting part 124 is not limited, and the insertion limiting part 124 may have various shapes as long as the insertion limiting part 124 may limit a position at which a predetermined region of the opposite ends of the cooling path part 110 in which the cut part 112 is formed is inserted into the plate 120.

Further, the insertion limiting part 124 may be formed by performing the forming process on at least one of the upper plate 121 or the lower plate 122, and it is a matter of course that the insertion limiting part 124 may be formed by various methods such as forming a separate insertion limiting part 124 and coupling the insertion limiting part 124 to at least one selected from the upper plate 121 and the lower plate 122.

In the heat exchanger 1000 for cooling an electrical device according to an embodiment of the present invention, various types of paths for the cooling fluid may be formed depending on disposition of the inflow and outflow part 200 including the inflow part 210 and the outflow part 220, and the connection block 300.

Here, at least one connection block 300 may be disposed between the connection plates 120 of the cooling assemblies 100.

In other words, in the case where the connection block 300 is disposed at each of opposite ends of the cooling assembly 100 between the cooling assemblies 100, a path for the cooling fluid is formed to have a parallel structure.

On the contrary, in the case where the connection block 300 is disposed at only one of the opposite ends in the length direction, a path for the cooling fluid is formed to have a series structure.

An example thereof will be described in more detail.

Figure 13:
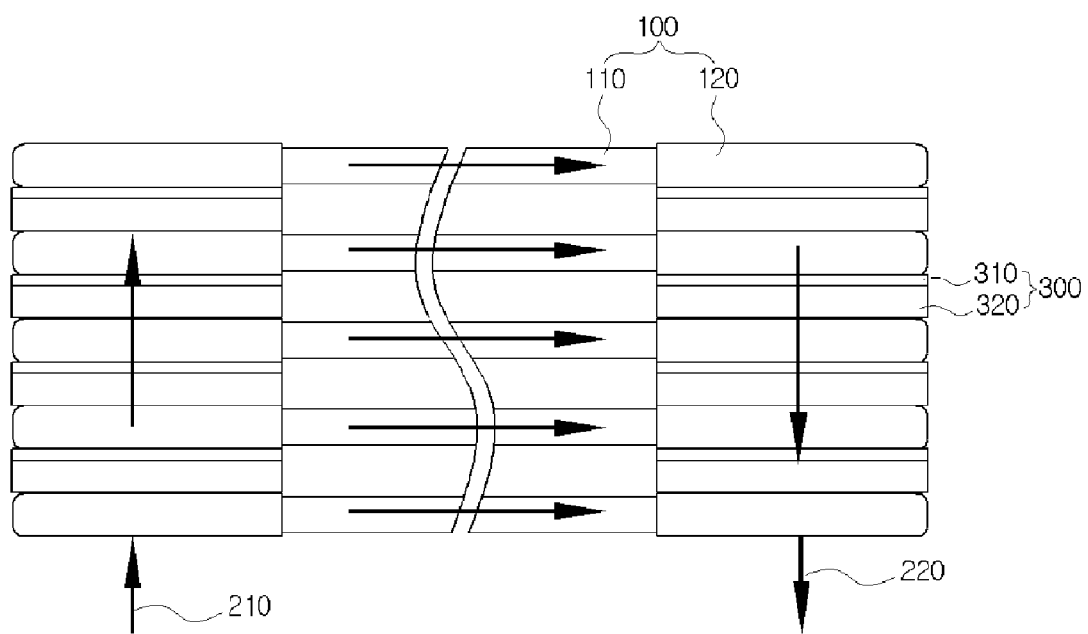
FIGS. 13 to 15 are views illustrating examples of a path, in which a cooling fluid flows, in the heat exchanger for cooling an electrical device according to an embodiment of the present invention.

In the heat exchanger 1000 for cooling an electrical device illustrated in FIG. 13, the inflow part 210 is connected to the left connection plate 120 of the lowermost connection plates 120, and the outflow part 220 is connected to the right connection plate 120.

Here, the connection block 300 is coupled between every adjacent connection plates 120.

Accordingly, in the heat exchanger 1000 for cooling an electrical device illustrated in FIG. 13, the cooling fluid flows in through the inflow part 210, moves upward, is distributed to the respective cooling path parts 110, moves in the length direction of the cooling path part 110, and flows out through the outflow part 220 positioned at a lower side of the heat exchanger 1000 for cooling an electrical device, along the path formed by the coupling of the cut part 112, the connection plate 120, and the connection block 300.

In other words, the heat exchanger 1000 for cooling an electrical device illustrated in FIG. 13 is configured to have the parallel structure, in which the cooling fluid moves in the same direction in all of the cooling path parts 110.

Figure 14:
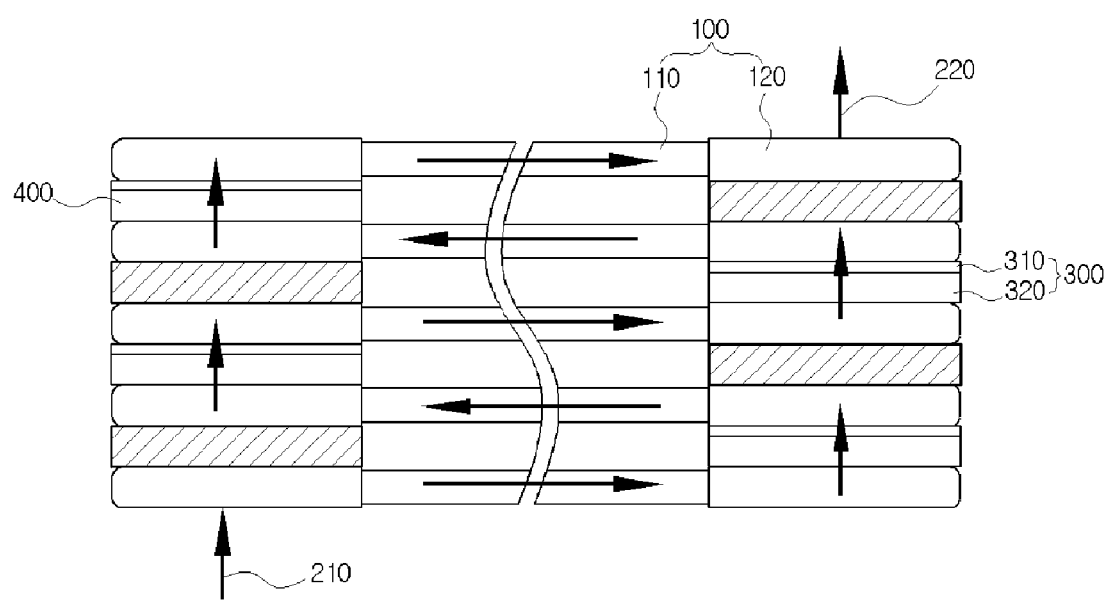

In the heat exchanger 1000 for cooling an electrical device illustrated in FIG. 14, the inflow part 210 is connected to the left connection plate 120 of the lowermost connection plates 120, and the outflow part 220 is connected to the right connection plate 120 of the uppermost plates 120.

Here, the connection block 300 is alternately coupled to the connection plate 120 in each layer.

Accordingly, in the heat exchanger 1000 for cooling an electrical device illustrated in FIG. 14, the cooling fluid flows in through the inflow part 210, a movement of the cooling fluid in which the cooling fluid moves to the right and then moves to the left in the next layer is repeated, and then the cooling fluid flows out through the outflow part 220 positioned at the uppermost layer.

In other words, the heat exchanger 1000 for cooling an electrical device illustrated in FIG. 14 is configured to have the series structure, in which the cooling fluid moves in the opposite direction to that in an adjacent cooling path part 110.

Here, the heat exchanger 1000 for cooling an electrical device further includes a separate support block 400 disposed in a space in which the connection block 300 is not provided, and the support block 400 may allow an interval between the cooling path parts 110 to be maintained without the connection block 300.

Figure 15:
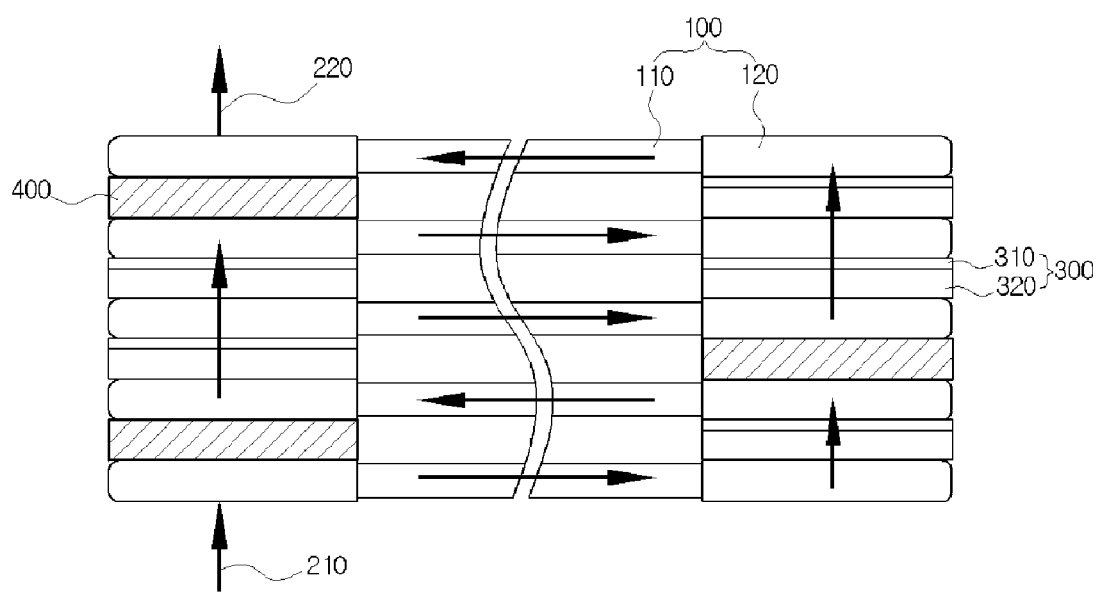

As another example, in the heat exchanger 1000 for cooling an electrical device illustrated in FIG. 15, the inflow part 210 is connected to the left connection plate 120 of the lowermost connection plates 120, and the outflow part 220 is connected to the uppermost connection plate 120.

In this example, the cooling fluid moves from the left to the right through the lowermost cooling path part 110, cooling fluid moves from the right to the left in the second layer, and then the cooling fluid is distributed in the third layer and the fourth layer to move to the right again, and moves to the left in the last layer to flow out through the outflow part 220.

In other words, the heat exchanger 1000 for cooling an electrical device illustrated in FIG. 15 is configured to have a structure in which the series structure and the parallel structure are mixed.

Various structures in which the series structure and the parallel structure are mixed other than the above-described structure may be used to move the cooling fluid in a direction desired by a user, thereby cooling the electrical device 1.

The present invention is not limited to the above-described embodiments, but may be variously applied. In addition, the present invention may be variously modified by those skilled in the art to which the present invention pertains without departing from the gist of the present invention claimed in the claims.

What is claimed:

1. A heat exchanger for cooling an electrical device, the heat exchanger comprising:
   cooling assemblies each including a cooling path part including a cooling path in which a cooling fluid flows, and connection plates into which opposite ends of the cooling path part in a length direction are inserted, respectively, and coupled to the cooling path part while in contact with opposite ends of the cooling path part in a height direction;
   an inflow part connected to one of uppermost connection plates or lowermost connection plates of multiple cooling assemblies stacked in the height direction to allow the cooling fluid to flow in, and an outflow part connected to one of a remaining connection plate to allow the cooling fluid to flow out; and
   a connection block connected between the connection plates and forming a path in a stacking direction;
   wherein the opposite ends of the cooling path part in the length direction are open, and the cooling path part further includes cut parts formed by cutting inner sides of the opposite ends of the cooling path part in the length direction, and fixing parts formed at opposite ends of the cut part in a width direction, and the connection plate includes an upper plate coupled to the cooling path part to overlap with a predetermined region of an upper surface of each of the opposite ends of the cooling path part in the length direction, a lower plate coupled to the cooling path part so as to overlap with a predetermined region of a lower surface of each of the opposite ends of the cooling path part in the length direction, and a middle plate connecting the upper plate and the lower plate to each other in the height direction.

2. The heat exchanger of claim 1, wherein at least two or more cooling assemblies are stacked and at least one electrical device is inserted between the cooling path parts.

3. The heat exchanger of claim 2, wherein an interval between adjacent cooling path parts varies depending on a height of the electrical device inserted between the cooling path parts.

4. The heat exchanger of claim 1, wherein the connection plate has an upper plate through-hole and a lower plate through-hole formed to penetrate through the upper plate and the lower plate, respectively, at a position corresponding to a position of the cut part, the upper plate and the lower plate being positioned to be connected to one of the inflow and outflow part and the connection block.

5. The heat exchanger of claim 4, wherein the connection block includes an upper connection block which is in contact with a lower surface of the lower plate and has a communicating hole communicating with the lower plate through-hole, a lower connection block which is in contact with an upper surface of the upper plate, is coupled to the upper connection block, and has a communicating hole communicating with the upper plate through-hole, and a sealing member disposed in a region in which the upper connection block and the lower connection block are coupled to each other to prevent a leakage of a cooling fluid.

6. The heat exchanger of claim 5, wherein the sealing member is one or more selected from a rubber gasket and a liquid gasket.

7. The heat exchanger of claim 5, wherein the connection block includes a first through-hole insertion part protruding upward at an edge of an upper side of the communicating hole of the upper connection block and inserted into the lower plate through-hole, and a second through-hole insertion part protruding downward at an edge of a lower side of the communicating hole of the lower connection block and inserted into the upper plate through-hole.

8. The heat exchanger of claim 1, wherein a partition wall extending in the length direction in the cooling path is formed in the cooling path part.

9. The heat exchanger of claim 1, wherein the connection plate includes an insertion limiting part formed in at least one of the upper plate or the lower plate to protrude inward in the height direction.

10. The heat exchanger of claim 1, wherein the path for a heat exchange medium varies depending on disposition of the inflow and outflow part and the connection block.

11. The heat exchanger of claim 10, wherein at least one connection block is disposed between the connection plates of the cooling assemblies stacked in multi-stages.

12. The heat exchanger of claim 10, further comprising a support block allowing a predetermined interval between the cooling path parts to be maintained.

13. The heat exchanger of claim 12, wherein heights of the connection block and the support block are the same as a height of the electrical device.

14. The heat exchanger of claim 8, wherein a thickness of a fixing part of the cooling path part in a width direction is larger than a thickness of the partition wall.

\* \* \* \* \*